United States Patent
Saitou et al.

(10) Patent No.: US 9,820,393 B2
(45) Date of Patent: Nov. 14, 2017

(54) MONITOR AND WORKING VEHICLE PROVIDED WITH THE MONITOR

(71) Applicants: Tomohiro Saitou, Hiratsuka (JP); Masahiko Hosaka, Hiratsuka (JP)

(72) Inventors: Tomohiro Saitou, Hiratsuka (JP); Masahiko Hosaka, Hiratsuka (JP)

(73) Assignee: Komatsu Ltd., Minato-ku, Tokyo (JP)

( * ) Notice: Subject to any disclaimer, the term of this patent is extended or adjusted under 35 U.S.C. 154(b) by 0 days.

(21) Appl. No.: 13/816,881

(22) PCT Filed: Nov. 8, 2012

(86) PCT No.: PCT/JP2012/079038
§ 371 (c)(1),
(2) Date: Dec. 13, 2013

(87) PCT Pub. No.: WO2014/024331
PCT Pub. Date: Feb. 13, 2014

(65) Prior Publication Data
US 2015/0216060 A1    Jul. 30, 2015

(30) Foreign Application Priority Data
Aug. 10, 2012 (JP) ................................. 2012-179005

(51) Int. Cl.
*H05K 5/00*     (2006.01)
*E02F 9/20*     (2006.01)
(Continued)

(52) U.S. Cl.
CPC .............. *H05K 5/003* (2013.01); *B60K 35/00* (2013.01); *B60K 37/06* (2013.01); *E02F 3/325* (2013.01);
(Continued)

(58) Field of Classification Search
CPC .......... G02F 1/133308; G02F 1/133311; G02F 2001/133314; H05K 5/003; E02F 5/145;
(Continued)

(56) References Cited

FOREIGN PATENT DOCUMENTS

| | | |
|---|---|---|
| GB | 2441689 A | 3/2008 |
| JP | H08-266711 A | 10/1996 |

(Continued)

OTHER PUBLICATIONS

Office Action dated Apr. 14, 2015 for corresponding German Patent Application No. 11-2012-006797.5, 8 pages.
International Search Report dated Jan. 29, 2013 from International Application No. PCT/JP2012/079038, 3 pages.

*Primary Examiner* — Jessica M Merlin
(74) *Attorney, Agent, or Firm* — Fish & Richardson P.C.

(57) ABSTRACT

A monitor includes a display in a form of a liquid crystal display, a monitor substrate that is electrically connected to the liquid crystal display, a connector that is used for electrical connection between the monitor substrate and an outside, and a resin-made exterior case that houses the liquid crystal display and the monitor substrate. On a back face opposed to the monitor substrate of the exterior case, a connector attachment portion is provided in a manner to be dented toward the connector. In the connector attachment portion, an opening from which the connector is exposed is provided. At least a part of an inner circumferential surface of the connector attachment portion is provided by an inclined surface portion that is enlarged toward the back face from an elevational portion (opening).

14 Claims, 5 Drawing Sheets

(51) Int. Cl.
  *G02F 1/133* (2006.01)
  *B60K 35/00* (2006.01)
  *B60K 37/06* (2006.01)
  *E02F 9/26* (2006.01)
  *E02F 3/32* (2006.01)
  *G02F 1/1333* (2006.01)

(52) U.S. Cl.
  CPC .............. *E02F 9/2004* (2013.01); *E02F 9/26* (2013.01); *G02F 1/133308* (2013.01); *B60Y 2200/41* (2013.01)

(58) Field of Classification Search
  CPC .......... E02F 9/2008; E02F 9/26; B60K 35/00; B60K 37/02; B60K 37/06; B60Y 2200/41
  See application file for complete search history.

(56) References Cited

FOREIGN PATENT DOCUMENTS

| | | | | |
|---|---|---|---|---|
| JP | H09-36560 A | | 2/1997 | |
| JP | H10-249022 A | | 9/1998 | |
| JP | H11-104328 A | | 4/1999 | |
| JP | 2001-311941 A | | 11/2001 | |
| JP | 2005-85831 A | | 3/2005 | |
| JP | 2006-211396 A | | 8/2006 | |
| JP | GB 2441689 A | * | 3/2008 | ............. B60R 11/02 |
| JP | 2008154827 A | * | 7/2008 | |
| JP | 2008154827 A | | 7/2008 | |
| JP | 2010-181433 A | | 8/2010 | |
| JP | 2010-256619 A | | 11/2010 | |
| JP | 2011-132800 A | | 7/2011 | |
| JP | 2012-92587 A | | 5/2012 | |

* cited by examiner

MONITOR AND WORKING VEHICLE PROVIDED WITH THE MONITOR

CROSS-REFERENCE TO RELATED APPLICATIONS

This application claims priority to International Application No. PCT/JP2012/079038 filed on Nov. 8, 2012, which application claims priority to Japanese Application No. 2012-179005, filed on Aug. 10, 2012. The contents of the above applications are incorporated herein by reference in their entireties.

TECHNICAL FIELD

The present invention relates to a monitor and a working vehicle provided with the monitor, particularly improvement in an exterior case of the monitor.

BACKGROUND ART

As a monitor mounted in a cab of a hydraulic excavator and the like, a monitor including a liquid crystal display has been typically known (see Patent Literature 1). In such a monitor, circuit substrates such as a power supply substrate and a control substrate are disposed on a back of the liquid crystal display. The circuit substrates are housed in a rear case made of aluminium. When a downsized monitor is used in a working vehicle such as a hydraulic excavator, a vision of an operator of the working vehicle is not hindered during operation while watching a working surface and the like.

Since a temperature inside the rear case is increased by heat generated from a liquid crystal display and a circuit substrate, a vent for ventilation is provided on a side wall of the rear case and a plurality of fins are provided on an outer surface of the rear case, so that the heat inside the rear case can be efficiently radiated outside.

Moreover, a plurality of connectors attached to the circuit substrate inside the rear case are exposed from a back of the rear case. To the connectors, a power cable from a battery mounted in the hydraulic excavator and a communication cable from a controller for controlling the entire hydraulic excavator are connected.

When a history of failure having occurred in the hydraulic excavator is stored in a storage within the monitor, a serviceman occasionally removes the communication cable, connects a communication cable, which is connected to a personal computer prepared for failure analysis, to the connector of the monitor, and downloads necessary data from the storage to the personal computer. In a hydraulic excavator having CAN (Controller Area Network), the data within the monitor is occasionally read via CAN without removing the communication cable connected to the monitor. In the occurrence of a phenomenon that the data cannot be downloaded, an operation for checking presence or absence of a connection failure and the like of the connector by inserting and removing the connector is performed. In the case of malfunction of the monitor, an operation of removing the communication cable from the monitor is naturally required.

The monitor disclosed in Patent Literature 1 is mounted in a relatively large-sized hydraulic excavator. In a small-sized hydraulic excavator provided with a cab or a canopy, a small-sized monitor is mounted. In the small-sized monitor, an exterior case and the like of the rear case and the like are made of resins in order to reduce weight and costs. In a frequently-travelling working vehicle such as a forklift, a lightweight monitor is required in terms of fuel consumption.

When the resin-made exterior case is used, since the fins for heat radiation have a larger heat resistance than that of a metal material (e.g., aluminium), heat radiation is not so expected even when an area for heat radiation is enlarged by providing the fins. Further, since a display device mounted in a hydraulic excavator provided with a canopy directly influenced by outside environments (exposure to rain, snow, dust and the like) is required to have sealability to ensure predetermined waterproof performance and dust resistance, a vent cannot be provided in the rear case. For this reason, it is necessary to radiate the inside heat through the outer surface of the exterior case by increasing a surface area of the outer surface.

CITATION LIST

Patent Literature(s)

Patent Literature 1: JP-A-2011-132800

SUMMARY OF THE INVENTION

Problem(s) to be Solved by the Invention

However, when the surface area of the outer surface of the exterior case is increased, a volume of an inner space of the exterior case increases, thereby increasing a distance between a connector attached to the circuit substrate and the outer surface of the exterior case. Accordingly, in order to expose the connector outside, it is necessary to attach the connector to the outer surface of the exterior case and connect the mutually separated connector and circuit substrate to each other by a cable, which entails increase in the number of components and a time-consuming assembly.

To cope with this, it is considered to provide a connector attachment portion that is provided on the outer surface of the exterior case in a manner to be dented toward the inside circuit substrate, and to expose the connector attached to the circuit substrate at the depth side of the connector attachment portion. However, depending on an inner structure of the exterior case, a sufficient size of the connector attachment portion cannot be always ensured, where fingers cannot be easily inserted into the connector attachment portion to make insertion/removal of the connector difficult, thereby deteriorating a workability of the above-described serviceman in replacement of the monitor, downloading and the like, or a workability in the monitor assembly.

An object of the invention is to provide an easily assembled monitor facilitating insertion/removal of a connector and capable of ensuring environment resistance such as dust resistance and waterproof performance, and a working vehicle provided with the monitor.

Means for Solving the Problem(s)

According to a first aspect of the invention, a monitor includes: a display; a circuit substrate that is electrically connected to the display; a connector that is used for electrical connection between the circuit substrate and an outside; a resin-made exterior case that houses the display and the circuit substrate; and a connector attachment portion that is provided on a planar portion of the exterior case opposed to the circuit substrate and includes a space dented toward the connector, in which the connector attachment portion includes an opening from which the connector is exposed, and at least a part of an inner circumferential surface of the connector attachment portion is provided by an inclined surface portion that is enlarged toward the planar portion from the opening.

Herein, an inclination of the inclined surface portion is different from an inclination by a typical draft of a resin product formed by metallic molding.

In a monitor according to a second aspect of the invention, the planar portion is defined as a back face, and the connector attachment portion includes: a rear opening that is open on the back face; and a side opening that is open on a side face at a position opposed to the inclined surface portion, the side face defining a box shape with the back face, and is in communicative connection with the rear opening.

In a monitor according to a third aspect of the invention, the side opening is partially closed by a side wall that is flush with the side face.

In a monitor according to a fourth aspect of the invention, the connector is positioned at a height lower than an edge of the side wall.

In a monitor according to a fifth aspect of the invention, the circuit substrate is fixed to the exterior case near the connector.

According to a sixth aspect of the invention, a monitor is installed near an operator's seat of a working vehicle and includes: a display provided by a liquid crystal display; a circuit substrate that is electrically connected to the display; a connector that is used for electrical connection between the circuit substrate and an outside; a resin-made exterior case that houses the display and the circuit substrate; and a connector attachment portion that is provided on a planar portion of the exterior case opposed to the circuit substrate and includes a space dented toward the connector, in which the connector attachment portion includes an opening from which the connector is exposed, at least a part of an inner circumferential surface of the connector attachment portion is an inclined surface portion that is enlarged toward the planar portion from the opening, the planar portion is defined as a back face, the connector attachment portion includes: a rear opening that is open on the back face; and a side opening that is open at a position on a side face opposed to the inclined surface portion, the side face defining a box shape with the back face, and is in communicative connection with the rear opening, the side opening is partially closed by a side wall that is flush with the side face, and the display is provided by a liquid crystal display having a display surface surrounded by control buttons disposed in an L shape.

According to a seventh aspect of the invention, a working vehicle includes the monitor according to the first to sixth aspects of the invention.

Herein, the working vehicle refers to a vehicle conceptually including a construction machine such as a hydraulic excavator and a wheel loader and an industrial vehicle such as a forklift. The same applies to the working vehicle in the sixth aspect of the invention.

According to the first and seventh aspects of the invention, advantages described below will be obtained. Since the connector attachment portion is formed to be dented in the planar portion of the exterior case and the connector of the circuit substrate is exposed from the opening provided in the depth side of the connector attachment portion, in order to connect an exterior cable to the connector of the circuit substrate, it is necessary to insert a connector attached to a tip end of the exterior cable into the connector attachment portion. At this time, in the first aspect of the invention, since a part of the inner circumferential surface of the planar portion is provided by the inclined surface portion that is inclined from the opening toward the planar portion, the opening becomes large by the inclined surface portion, so that the fingers pinching the connector of the cable can be inserted into the connector attachment portion without difficulty and insertion/removal of the connector can be facilitated.

Moreover, since the exterior case has a sufficient surface area by separating the planar portion from the opening and increasing a volume of the exterior case enough to form a large inner space according to a distance between the planar portion and the opening, heat from the circuit substrate and the liquid crystal display can be radiated outside through the outer surface of the exterior case. Here, the connector is disposed apart from the planar portion. However, in order to avoid deterioration of workability such as difficult pinching of the connector (of the cable) by fingers in insertion/removal of the connector (of the cable), the dented connector attachment portion is provided to facilitate insertion/removal of the connector (of the cable). Since heat is favorably radiated from the sufficient surface area of the exterior case, it is not necessary to provide a vent and the like for ventilation on the exterior case, thereby improving environment resistance such as dust resistance and waterproof performance.

According to the second aspect of the invention, since the side opening in communicative connection with the rear opening is provided at a part opposed to the inclined surface portion, the fingers pinching the connector of the cable can protrude out of the side opening, which provides a further allowance to the fingers inserted into the connector attachment portion to enhance workability.

According to the third aspect of the invention, since the side opening is partially closed by the side wall, rain, dust and the like from the side face are inhibited from entering the connector attachment portion to further improve environment resistance.

According to the fourth aspect of the invention, since the entire connector is positioned at the depth side of the connector attachment portion and does not protrude out of the side wall, the fitting portion to the connector of the cable is also positioned at the depth side, which makes it more difficult for rain and dust to enter the fitting portion.

According to the fifth aspect of the invention, since the circuit substrate is directly screwed to the exterior case near the connector, the circuit substrate can be firmly fixed. Accordingly, when the connector of the cable is pulled out from the connector installed on the circuit substrate, since the circuit substrate around the connector is not deformed by being pulled, breaking of the circuit can be prevented.

According to the sixth aspect of the invention, the advantages of the first, second and third aspects of the invention can be simultaneously obtained. In addition, since the control buttons are disposed in an L shape around the display surface, a compact layout of the control buttons becomes possible to promote further downsizing of the monitor.

DESCRIPTION OF EMBODIMENT(S)

An exemplary embodiment of the invention will be described below with reference to attached drawings.

Figure 1:
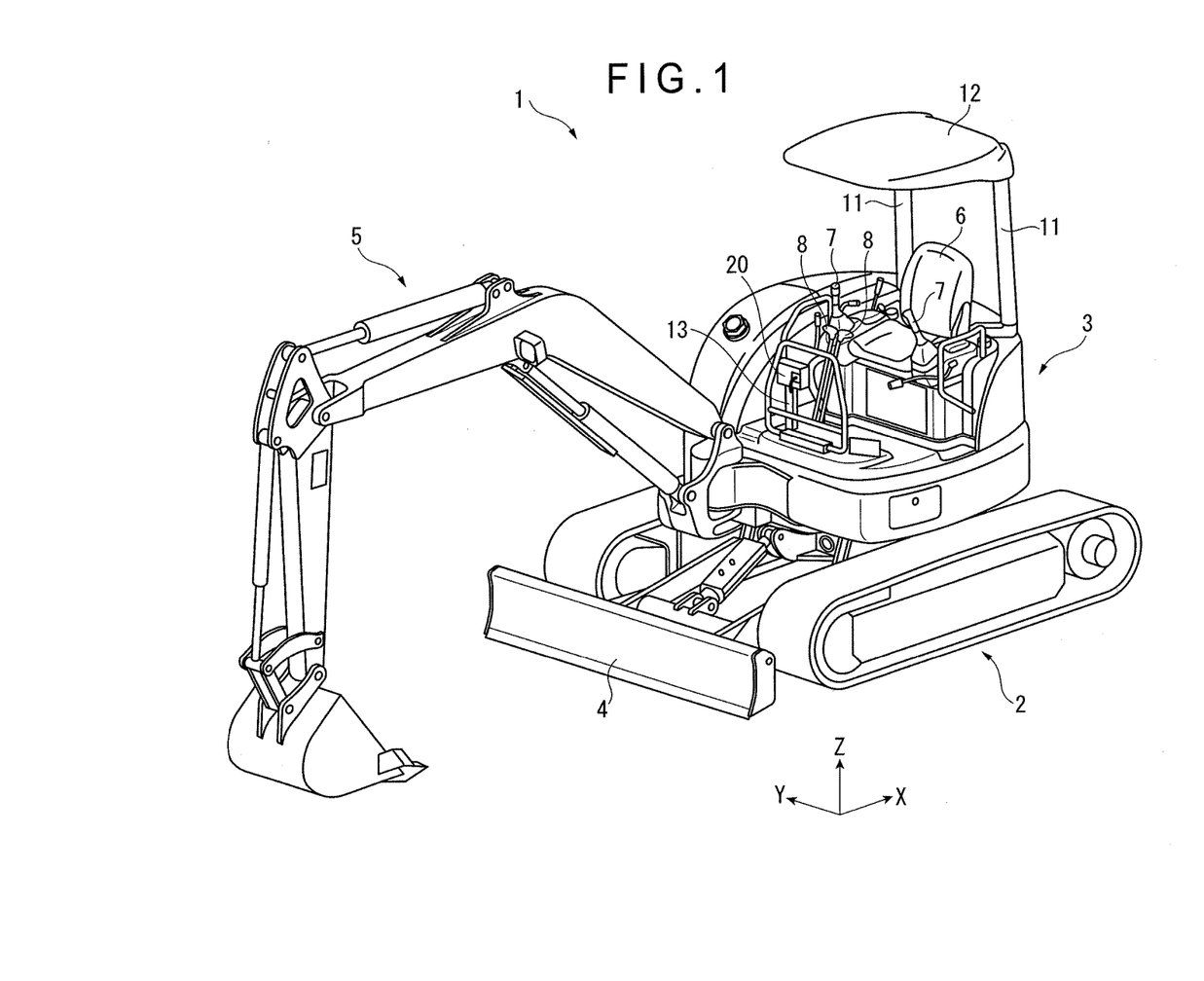
FIG. 1 is a perspective view showing a hydraulic excavator (i.e., a working vehicle) according to an exemplary embodiment of the invention.
Figure 2:
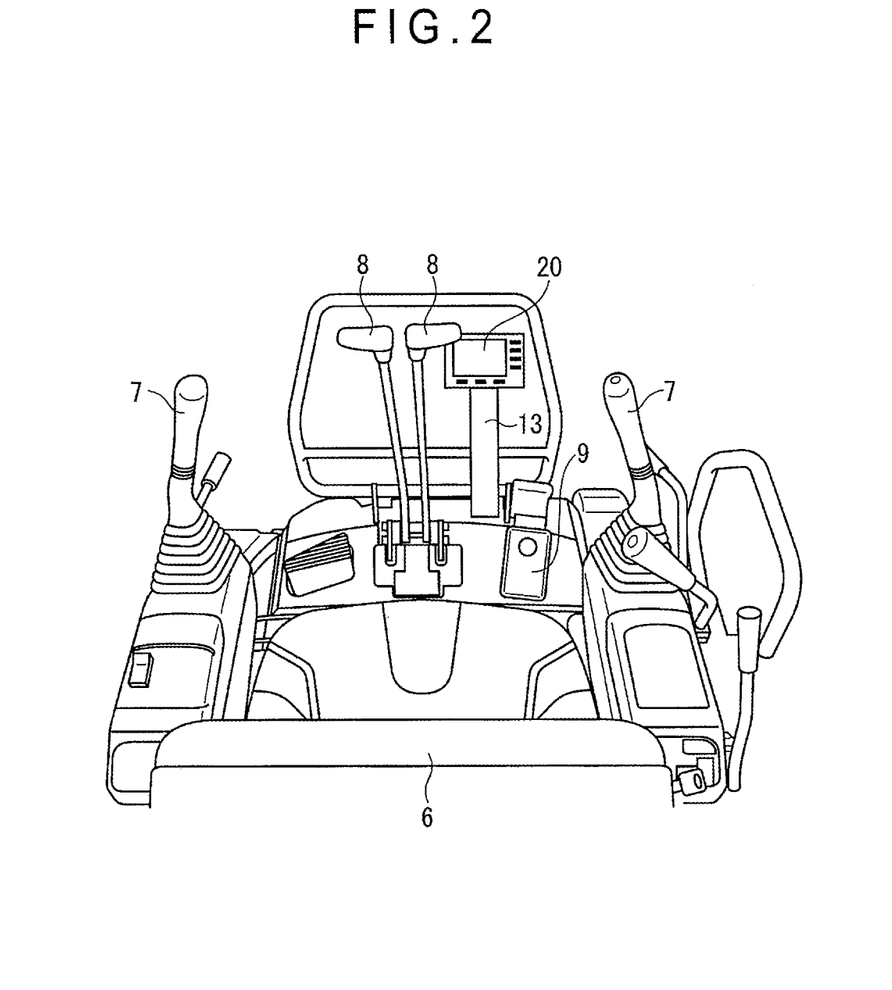
FIG. 2 illustrates the hydraulic excavator as viewed from an operator's seat facing forward.

FIG. 1 is a perspective view of an entirety of a small-sized hydraulic excavator 1 serving as a working vehicle according to the exemplary embodiment. FIG. 2 illustrates the hydraulic excavator 1 as viewed from an operator's seat 6 facing forward.

In FIGS. 1 and 2, the hydraulic excavator 1 is provided with a crawler undercarriage 2, an upper revolving body 3 rotatably mounted on the undercarriage 2, a blade 4 that is provided in front of the undercarriage 2 and is liftable by a hydraulic actuator, and working equipment 5 that is provided in front of the upper revolving body 3. Since the working equipment 5 is well-known one in which a boom, an arm and a bucket are individually driven by a hydraulic actuator, a detailed description of the working equipment 5 will be omitted.

The upper revolving body 3 is provided with working equipment control levers 7,7 on the right and left of the operator's seat 6, traveling levers 8, 8 on a front side of a floor, a control pedal 9 for swinging the boom, and the like (see FIG. 2). The hydraulic excavator 1 in this exemplary embodiment is designed to have a canopy, including a roof 12 supported by two columns 11 standing on the upper revolving body 3 above the operator's seat 6. Further, in the hydraulic excavator 1, a monitor 20 supported by a support frame 13 standing on the floor is provided next to the traveling levers 8. A position of the monitor 20 as shown in FIG. 2 is one example. The monitor 20 may be positioned in a console on the right of the operator's seat 6.

The monitor 20 will be described in details with reference to FIG. 3. The monitor 20 includes a liquid crystal display. Display contents of the liquid crystal display are switchable by operating a plurality of control buttons. Examples of the display contents include a service meter, an engine water temperature gauge, an engine fuel gauge, a preheat monitor, an engine hydraulic monitor, a driving acceleration monitor, an electric system alarm monitor, a fuelometer and a current time. The monitor 20 may be provided by a touch panel in which a plurality of control switches are installed on the liquid crystal display to integrate a display function and an operation function. The liquid crystal display may be replaced by an organic electroluminescent display.

Figure 3:
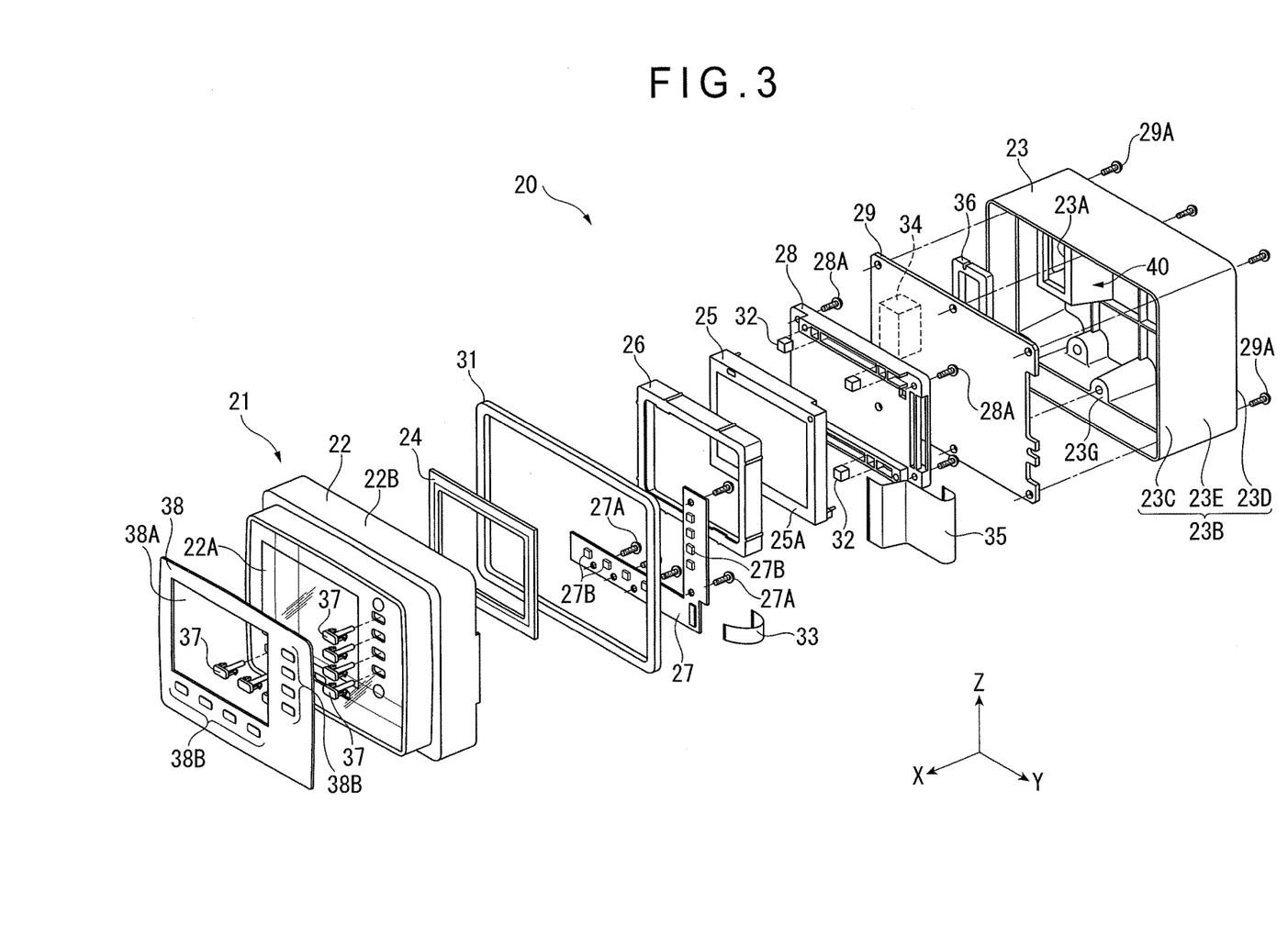
FIG. 3 is an exploded perspective view showing a monitor mounted in the hydraulic excavator.

FIG. 3 is an exploded perspective view showing the monitor 20.

In FIG. 3, the monitor 20 includes an exterior case 21 including a front case 22 and a rear case 23, both of which are shaped in a bottomed box. The front case 22 is formed in a two-color molding with a front face 22A made of a transparent acrylic resin and a surface portion 22B made of a black AES (acrylonitrile/ethylene-propylene-diene/styrene) resin. The rear case 23 is entirely molded by a black ABS (acrylonitrile-butadiene-styrene) resin. Note that the front case 22 and the rear case 23 may be provided in other colors instead of black. The AES resin is superior to the ABS resin in weather resistance. Accordingly, in the display device mounted in the working vehicle and exposed outside as in the exemplary embodiment, the AES resin is preferably applied to the front case of the monitor.

A rectangular housing is provided at a back of the transparent front face 22A of the front case 22. A display in a form of a liquid crystal display 25 is housed in the housing through a resin frame 24 shaped in a thin plate. At this time, a metallic framing case 25A forming an outer circumference of the liquid crystal display 25 is fitted in an elastic rubber frame 26. The rubber frame 26 absorbs vibration applied on the liquid crystal display 25, thereby securing durability of the liquid crystal display 25. At the same time, the rubber frame 26 absorbs a difference in thermal expansion between the resin-made front case 22 and the metallic framing case 25A, thereby preventing breakage of the front case 22 or the liquid crystal display 25.

In the assembled monitor 20, a display surface 38A of the liquid crystal display 25 (a display surface of a finisher sheet 38) and a control button 38B (a part of the finisher sheet 38 covering a knob switch 37) are substantially coplanar. An L-shaped switch substrate 27 is provided surrounding the liquid crystal display 25 (as shown in FIG. 3, in a positive direction of a Y axis and in a negative direction of a Z axis viewed from the liquid crystal display 25). Moreover, control buttons are provided to form an L shape around the display surface 38A (see FIG. 3). In the exemplary embodiment (FIG. 3), for instance, four control buttons are vertically provided while four control buttons are horizontally provided. However, the number of the control buttons may depend on the function of the monitor 20. A switch 27B (a tact switch) is mounted on the switch substrate 27 in a manner to correspond to the location and the number of the control buttons. When any control button 38B on an operation surface is pressed, the knob switch 37 is displaced in the negative direction of the X axis shown in FIG. 3, whereby a tip end of the knob switch 37 presses a surface of the switch 27B mounted on the switch substrate 27, so that the switch 27B generates an electric signal. The electric signal is transmitted to the monitor substrate 29. For instance, when the control button is operated for causing a screen transition of the liquid crystal display 25 to a predetermined screen, a control signal for the screen transition is transmitted from the monitor substrate 29 to a driving-circuit substrate (not shown) integrally installed with the liquid crystal display 25.

The switch substrate 27 is screwed by screws 27A on a plurality of mounting bosses (not shown) that are integrally formed with the front face 22A and project toward the rear case 23. A plurality of mounting bosses similarly formed (not shown) are provided on the front face 22A. A resin-made holder 28 is screwed by screws 28A on the mounting bosses. Four rubber pressing members 32 are respectively attached at separate positions of the top, the bottom, the right and the left of a front surface of the holder 28 (in the positive direction of the X axis shown in FIG. 3). The holder 28, once attached on the mounting bosses, presses the liquid crystal display 25 from the back thereof (in the negative direction of the X axis shown in FIG. 3) through the pressing member 32, thereby holding the liquid crystal display 25 in order to avoid displacement of the liquid crystal display 25 within the housing.

Another plurality of mounting bosses (not shown) are formed at four corners of the front face 22A. A monitor substrate 29 in which a power supply circuit and a control circuit for the liquid crystal display 25 are formed is placed on the mounting bosses. The holder 28 and the monitor substrate 29 are disposed in a manner to separate from each other with a predetermined interval (at an interval separated in the X direction shown in FIG. 3). The above-described components are housed in the front case 22, into which the rear case 23 is fitted through a gasket 31 formed of urethane for attachment. The rear case 23 is screwed for attachment by screws 29A to the mounting bosses on which the monitor substrate 29 is placed. In other words, the monitor substrate 29 and the rear case 23 are tightened together and attached while being held between the mounting bosses and a screw insertion portion 23G of the rear case 23 (FIG. 3).

Moreover, the switch substrate 27 and the monitor substrate 29 are electrically connected to each other through a flat cable 33. The monitor substrate 29 and a drive substrate for a drive circuit (not shown) which is integrally formed with the liquid crystal display 25 are also connected to each other through a flat cable 35. A substrate for a drive circuit (not shown) receives the control signal from the monitor substrate 29 and controls which color is to be displayed on the liquid crystal display 25.

On the back (in the negative direction of the X axis in FIG. 3) of the monitor substrate 29, a connector (a socket) 34, to which an exterior cable for power supply and signal communication is connected, is installed. A connector attachment portion 40 is provided on the rear case 23 in a manner to be dented toward a connector 34 positioned on a front side (in the positive direction of the X axis shown in FIG. 3). The connector attachment portion 40 will be described in detail below. The connector 34 is exposed outside through an opening 23A provided on the rear case 23. A gasket 36 formed of urethane is attached around the opening 23A for forming the connector attachment portion 40 in the rear case 23 to seal a gap generated between the opening 23A and the connector 34. As described above, the monitor 20 has an airproof structure to avoid water and dust from entering an inside of the monitor 20 from the outside.

On the other hand, from a front side of the front case 22, a plurality of knob switches 37 are inserted into the front face 22A of the front case 22. At the tip end of the knob switch 37, the switch 27B installed in the switch substrate 27 is positioned. Pressing the knob switch 37 through the finisher sheet 38 thereon as described above enables the switch 27B to be operated and the display contents of the liquid crystal display 25 to be switched. When the touch panel is used as described above, since the functions of the knob switch 37 and the switch 27B are installed on the touch panel, the knob switch 37 becomes unnecessary. However, the monitor 20 may be provided by a combination of the touch panel, the knob switch 37 and the switch 27B by providing no function to the touch panel while uniquely providing a specific function to the knob switch 37. The resin-made finisher sheet 38 is attached on the front face 22A in a manner to cover even the knob switch 37.

As shown in FIG. 3, among the above-described components, the components from the resin frame 24 to the monitor substrate 29 are contained in the front case 22 while only the connector 34 installed on the monitor substrate 29 protrudes beyond the front case 22 in the negative direction of the X axis (toward the rear case 23) shown in FIG. 3. Accordingly, in the assembled monitor 20, the rear case 23 has an inner space of a large capacity therein. In the inner space, only the connector 34 is located and most of the inner space is kept unoccupied. In other words, the large inner space of the rear case 23 is created by intentionally enlarging a surface area of a surface portion 23B of the rear case 23. By enlarging the surface area of the surface portion 23B, heat generated from the monitor substrate 29 and the liquid crystal display 25 is efficiently radiated outward through the surface portion 23B. Due to the large inner space of the rear case 23, the monitor 20 is enlarged in size in the X direction of FIG. 3. Since an operator's eye direction is the X direction during operations such as digging using a working vehicle, unless the monitor 20 is enlarged in the Y direction or the Z direction of FIG. 3, an operator's view during operations is not disturbed, so that operability is not affected.

Figure 4:
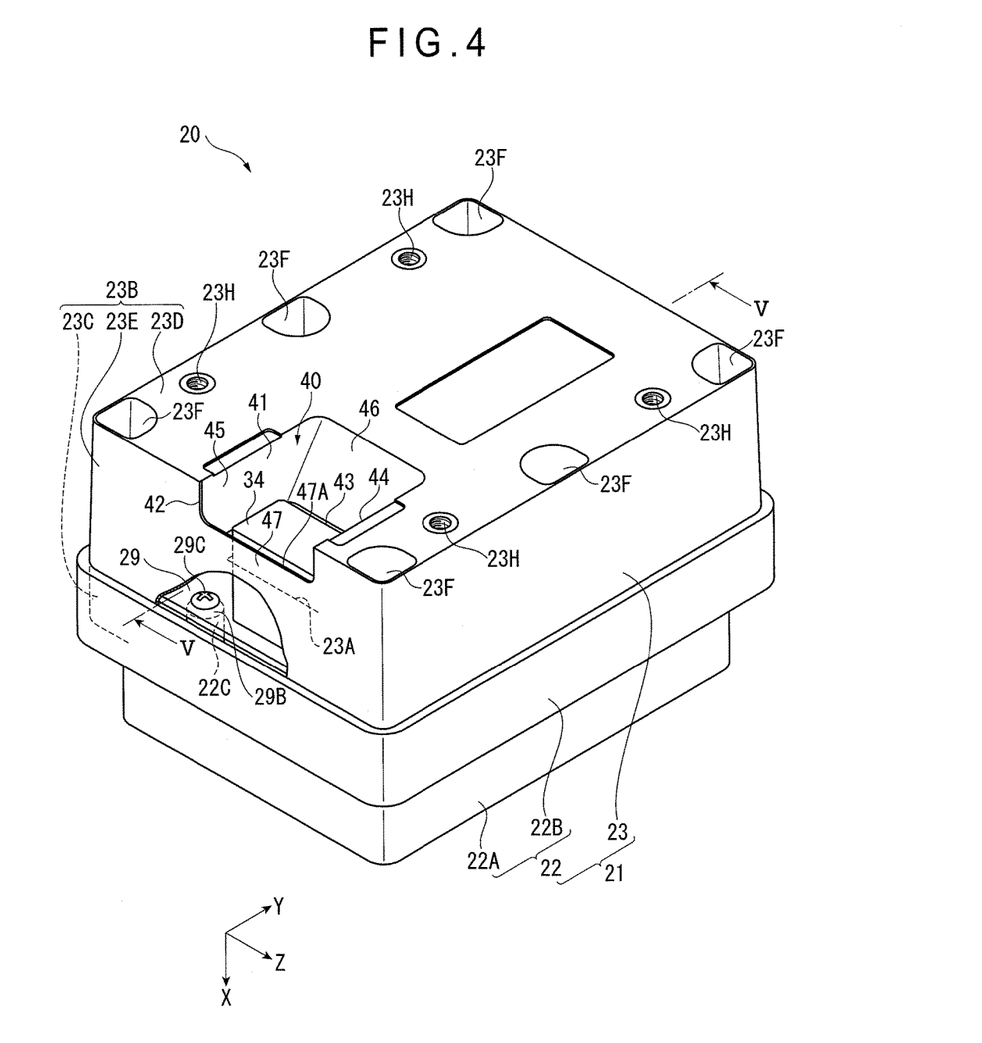
FIG. 4 is a perspective view showing a back of the monitor.
Figure 5:
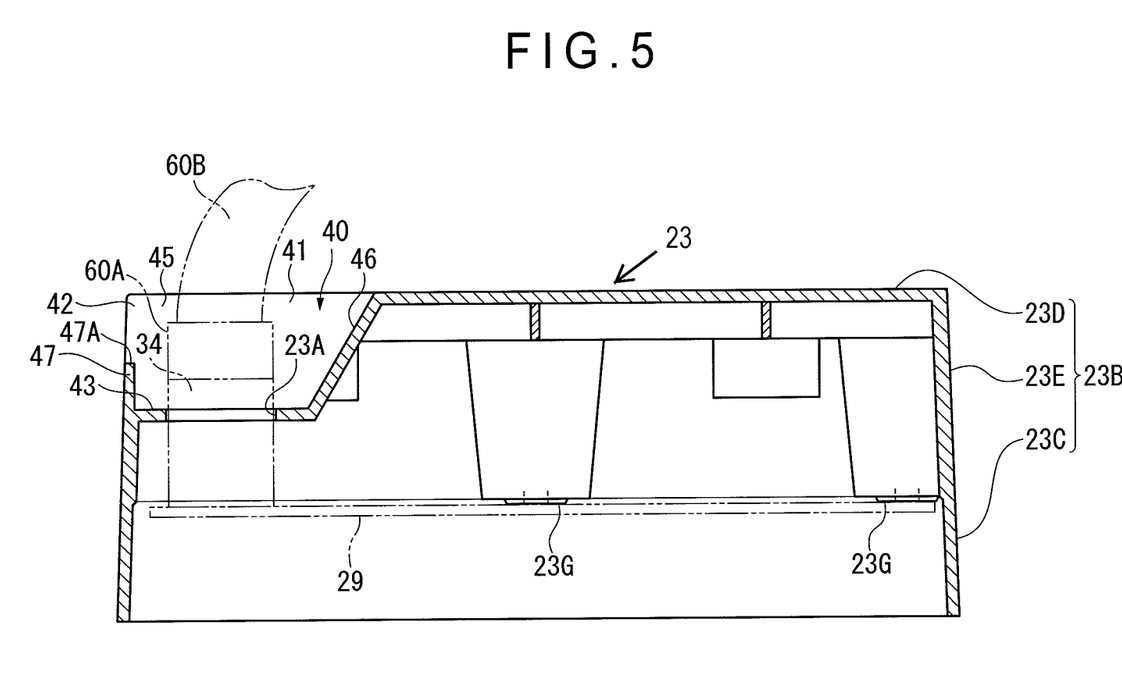
FIG. 5 is a cross-sectional view showing a rear case of the monitor and taken along a V-V line in FIG. 4.

FIG. 4 is a perspective view showing the back of the monitor 20. FIG. 5 is a cross-sectional view showing a rear case 23 and taken along the V-V line in FIG. 4.

In FIGS. 4 and 5, the surface portion 23B of the rear case 23 includes: a fitting portion 23C that is fitted into the front case 22 at completion of assembly; a back face 23D (a planar portion) opposed to the inside monitor substrate 29; and a side face 23E that bridges the fitting portion 23C and the back face 23D.

At a position of the back face 23D corresponding to the connector 34, the connector attachment portion 40 is provided in a manner to be dented toward the monitor substrate 29 positioned on the front side (in the positive direction of the X axis shown in FIG. 4). The connector attachment portion 40 includes: a rear opening 41 that is open on the back face 23D; and a side opening 42 that is open on the side face 23E defining a box shape with the back face 23D, and is in communicative connection with the rear opening 41. The connector attachment portion 40 further includes: an elevational portion 43 that is substantially vertical (in parallel to the Y direction shown in FIG. 4) and includes the opening 23A into which the connector 34 is inserted; an upper face 44 and a lower face 45 that are opposed to each other and are substantially in parallel to the X direction shown in FIG. 4; and an inclined surface portion 46 that is opposed to the side opening 42 and the Y direction shown in FIG. 4. In the exemplary embodiment, the upper face 44, the lower face 45 and the inclined surface portion 46 provide the inner circumferential surface of the connector attachment portion 40.

Among these, the inclined surface portion 46 for partially forming the inner circumferential surface of the connector attachment portion 40 stands upright from the elevational portion 43 and is enlarged and inclined toward the back face 23D (see FIG. 5). Accordingly, when a connector (plug) 60A of a cable 60B is inserted into and removed from the connector 34 in the connector attachment portion 40, the fingers for pinching the connector 60A of the cable are easily inserted, which enables prompt and easy insertion/removal of the connector. An inclination angle of the inclined surface portion 46 only needs to be set in view of a depth of the connector attachment portion 40 and a size of the elevational portion 43. For instance, the inclination angle is set at an angle at which the fingers are easily inserted.

Moreover, since the side opening 42 is provided opposite to the inclined surface portion 46, the fingers pinching the connector 60A of the cable 60B may protrude out of the side opening 42, so that insertion/removal of the connector 60A can be facilitated.

The side opening 42 is shaped by partially cutting out the side face 23E substantially in a quadrangle. The side opening 42 is continuous to the elevational portion 43, the upper face 44 and the lower face 45 and is closed by a side wall 47 flush with the side face 23E. A height of the side wall 47 in the negative direction of the X axis shown in FIG. 4 is higher (i.e., larger in the negative direction of the X axis shown in FIG. 4) than a fitting surface between the connector 34 and the connector 60A of the cable 60B. In other words, the connector 34 is positioned at a height lower than an edge 47A of the side wall 47. Provision of such a side wall 47 inhibits rain and the like from falling into or dust from entering the connector attachment portion 40 from a lateral side (in the negative direction of the Y axis shown in FIG. 4) and the like. With such a side wall 47, since the side wall 47 does not entirely close the side opening 42, insertion/removal of the connector is not disturbed, so that workability can be kept favorable and environment resistance such as dust resistance and waterproof performance can be ensured.

As shown in FIG. 4, six recesses 23F are provided adjacent to a periphery of the back face 23D. Each of the recesses 23F is formed for providing a screw insertion portion 23G into which a screw 29A is inserted (FIG. 3), and bulges toward an inside of the rear case 23 to form a boss (see FIG. 5). Further, on the back face 23D, a bolt hole 23H for bolting the monitor 20 to a support frame 13 (FIGS. 1 and 2) is provided.

The monitor substrate 29, to which the connector 34 is installed, and the rear case 23 are tightened together using a plurality of screws 29A to be screwed into the front case 22. In addition, as shown in a see-through part in FIG. 4, the monitor substrate 29 is directly attached to a mounting boss 22C provided in the rear case 23, using a single screw 29C to be inserted into a mounting portion 29B of the monitor substrate 29. The mounting portion 29B is provided adjacent to the connector 34, so that the monitor substrate 29 is more firmly fixed around the connector 34. With this arrangement, when the connector 60A of the cable 60B as shown in FIG. 5 is removed from the connector 34, the monitor substrate 29 can be prevented from being deformed by being pulled together, and breaking of circuits formed on the monitor substrate 29 and damage to electronic components can be prevented.

Incidentally, the invention is not limited to the above-described exemplary embodiment, but includes modifications and improvements as long as the objects of the invention can be achieved.

Although the exemplary embodiment describes that the monitor of the invention is exemplarily installed in the hydraulic excavator 1, the monitor of the invention may be installed in a working vehicle such as other construction machines (e.g., a wheel loader) and industrial vehicles (e.g., a forklift). In the case of the forklift, the monitor may be provided by a display device for displaying display contents peculiar to the forklift. Examples of the display contents include directions in which a fork claw is lifted and lowered, a load applied on the fork claw, a load applied on a travelling wheel and a travelling speed. In the case of a battery-powered forklift, the monitor may be provided by a display device for displaying various information such as a battery charge amount and electric power consumption.

In the connector attachment portion 40 according to the above exemplary embodiment, the inclined surface portion 46 defined as a surface positioned in the Y direction of FIG. 4 relative to the side opening 42 is inclined in the negative direction of the Y axis. However, only the lower face 45 may be inclined, or the lower face 45 as well as the inclined surface portion 46 may be inclined. Instead of providing the side opening 42, an inclined surface portion similar to the inclined surface portion 46 may be provided while the side face 23E is not opened.

When the monitor 20 is installed in a working vehicle, the positive direction of the Z axis shown in FIG. 4 refers to the top relative to the ground. In a hydraulic excavator provided with a canopy, a wheel loader, or a forklift used for an outdoor work, which are used in severe working environments in terms of dust resistance and waterproof performance, it is desirable to form the upper face 44 substantially horizontal and to use an edge on the border between the upper face 44 and the back face 23D as a draining portion of rain falling along the back face 23D to prevent the rain from entering the connector attachment portion 40. Accordingly, although the lower face 45 is exemplarily inclined in the above description, it is unfavorable that the upper face 44 is inclined.

However, in a design where the entire monitor 20 is covered with a dashboard or the like, since there is no risk that rain and the like fall over the monitor 20 and rain falling along the back face 23D enters the connector attachment portion 40 through the upper face 44, the upper face 44 may be inclined in order to improve a workability in insertion/removal of the connector of the cable (not shown).

In the exemplary embodiment, the connector attachment portion 40 is provided on the back face 23D of the rear case 23. However, the connector attachment portion 40 may be provided on the side face 23E of the rear case 23 or the surface portion 22B of the front case 22.

In the exemplary embodiment, the opening 23A from which the connector 34 is exposed is provided on the elevational portion 43 of the connector attachment portion 40. However, without providing such an elevational portion, the opening may be provided to occupy an entirety of the depth side of the connector attachment portion.

The invention claimed is:

1. A monitor comprising:
a display;
a circuit substrate that is electrically connected to the display;
a first connector that is installed on the circuit substrate and is configured to be connected to a second connector of an exterior cable;
a resin-made exterior case that houses the display and the circuit substrate; and
a connector attachment portion that is provided on a planar portion of the exterior case opposed to the circuit substrate, the connector attachment portion defining a space that is dented from the planar portion toward the first connector, wherein
the connector attachment portion comprises an opening through which the first connector protrudes such that an end of the first connector is exposed to an outside of the exterior case,
at least a part of an inner circumferential surface of the connector attachment portion is provided by an inclined surface portion that is enlarged toward the planar portion from the opening, and
an installation side of the first connector to the circuit substrate is disposed in an inner space of the exterior case.

2. The monitor according to claim 1, wherein
the planar portion is defined as a back face, and
the connector attachment portion comprises: a rear opening that is open on the back face; and a side opening that is open on a side face at a position opposed to the inclined surface portion, the side face defining a box shape with the back face, and is in communicative connection with the rear opening.

3. The monitor according to claim 2, wherein
the side opening is partially closed by a side wall that is flush with the side face.

4. The monitor according to claim 3, wherein
the first connector is positioned at a height lower than an edge of the side wall.

5. The monitor according to claim 1, wherein
the circuit substrate is fixed to the exterior case near the first connector.

6. The monitor according to claim 1, wherein the end of the first connector that is exposed to the outside of the exterior case is positioned within the dented space of the connector attachment portion.

7. The monitor according to claim 1, wherein the first connector is configured to be connected to the second connector of the exterior cable within the dented space of the connector attachment portion.

8. A monitor installed near an operator's seat of a working vehicle, the monitor comprising:
a display provided by a liquid crystal display;
a circuit substrate that is electrically connected to the display;
a first connector that is installed on the circuit substrate and is configured to be connected to a second connector of an exterior cable;
a resin-made exterior case that houses the display and the circuit substrate; and
a connector attachment portion that is provided on a planar portion of the exterior case opposed to the circuit substrate, the connector attachment portion defining a space that is dented from the planar portion toward the first connector, wherein
the connector attachment portion comprises an opening through which the first connector protrudes such that an end of the first connector is exposed to an outside of the exterior case,
at least a part of an inner circumferential surface of the connector attachment portion is an inclined surface portion that is enlarged toward the planar portion from the opening,
an installation side of the first connector to the circuit substrate is disposed in an inner space of the exterior case,
the planar portion is defined as a back face,
the connector attachment portion comprises: a rear opening that is open on the back face; and a side opening that is open at a position on a side face opposed to the inclined surface portion, the side face defining a box shape with the back face, and is in communicative connection with the rear opening,
the side opening is partially closed by a side wall that is flush with the side face, and
the display is provided by a liquid crystal display having a display surface surrounded by control buttons disposed in an L shape.

9. A working vehicle comprising the monitor according claim 1.

10. A working vehicle comprising the monitor according to claim 8.

11. The monitor according to claim 1, wherein
at least a part of the inner circumferential surface of the connector attachment portion is provided by an upper face and an opposing lower face that each extends from the planar portion to the opening.

12. The monitor according to claim 8, wherein
at least a part of the inner circumferential surface of the connector attachment portion is provided by an upper face and an opposing lower face that each extends from the planar portion to the opening.

13. The monitor according to claim 8, wherein the end of the first connector that is exposed to the outside of the exterior case is positioned within the dented space of the connector attachment portion.

14. The monitor according to claim 8, wherein the first connector is configured to be connected to the second connector of the exterior cable within the dented space of the connector attachment portion.

\* \* \* \* \*